United States Patent
Hayashi

(10) Patent No.: US 8,081,510 B2
(45) Date of Patent: Dec. 20, 2011

(54) SEMICONDUCTOR INTEGRATED CIRCUIT AND UNSTABLE BIT DETECTION METHOD FOR THE SAME

(75) Inventor: Tomonori Hayashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 547 days.

(21) Appl. No.: 12/314,978

(22) Filed: Dec. 19, 2008

(65) Prior Publication Data

US 2009/0168539 A1    Jul. 2, 2009

(30) Foreign Application Priority Data

Dec. 27, 2007    (JP) ................................. 2007-337434

(51) Int. Cl.
*G11C 11/34* (2006.01)

(52) U.S. Cl. .............. 365/185.07; 365/189.15; 365/196; 365/207

(58) Field of Classification Search ............. 365/185.09, 365/189.15, 196, 207
See application file for complete search history.

(56) References Cited

U.S. PATENT DOCUMENTS

2004/0008544 A1*    1/2004    Shinozaki et al. ........ 365/189.05

FOREIGN PATENT DOCUMENTS

| JP | 8-178976 | 7/1996 |
| JP | 2005-222202 | 8/2005 |

* cited by examiner

*Primary Examiner* — Jason Lappas

(74) *Attorney, Agent, or Firm* — McGinn IP Law Group, PLLC

(57) ABSTRACT

A semiconductor integrated circuit including a nonvolatile memory cell is provided with a detection/word line voltage control circuit for sequentially supplying two or more mutually different unstable bit detecting voltages to a control gate of the nonvolatile memory cell to cause the nonvolatile memory cell to output a plurality of pieces of readout data, and an OK/NG determination circuit for comparing the plurality of pieces of readout data to determine whether the nonvolatile memory cell is stable or not.

18 Claims, 14 Drawing Sheets

| NODE NAME | DATA | DATA | DATA |
|---|---|---|---|
| Node 1' | DataValue 1 | DataValue 2 | DataValue 3 |
| Node 2' | DataValue 1 | DataValue 2 | DataValue 3 |
| Node 3' | DataValue 1 | DataValue 2 | DataValue 3 |

SigSW4-a

SigSW4-b

SigSW4-c

| | | | |
|---|---|---|---|
| Node 1 | DataValue 1 | DataValue 1 | DataValue 1 |
| Node 2 | PREVIOUS DATA | DataValue 2 | DataValue 2 |
| Node 3 | PREVIOUS DATA | PREVIOUS DATA | DataValue 3 |

FIG. 8

SEMICONDUCTOR INTEGRATED CIRCUIT AND UNSTABLE BIT DETECTION METHOD FOR THE SAME

This application is based upon and claims the benefit of priority from Japanese patent application No. 2007-337434, filed on Dec. 27, 2007, the disclosure of which is incorporated herein in its entirety by reference.

BACKGROUND OF THE INVENTION

The present invention relates to a semiconductor integrated circuit including a nonvolatile memory cell array and particularly relates to an unstable bit detection method for the same.

A nonvolatile memory such as a flash memory holds information written therein even after an external power supply is shut down. Therefore, once information relating to control of another circuit or the like (e.g. flags) is written in a nonvolatile memory, the information written in the nonvolatile memory can be referred to, even if power supply to the circuit to be controlled is shut down, so that the circuit to be controlled can be easily returned to normal operation.

For example, an ECU (electronic control unit) is provided with a nonvolatile memory, and is arranged such that a value "AA" to indicate normal operation is set in the nonvolatile memory when the ECU operates, and the value is reset to "00" when the operation is completed. Then, if power supply shutdown occurs during operation of the ECU, the value in the nonvolatile memory remains at "AA", and it can be known that the operation of the ECU has not been terminated normally when power is supplied to the ECU next time. Such a technique is described for example in Japanese Laid-Open Patent Publication No. H08-178976.

Additionally, when an operation such as write operation is performed on a flash memory, information to follow up this operation is written in a separate nonvolatile memory. This makes it possible to know, even if power supply to the flash memory is shut down, the state of the flash memory based on the follow-up information written in the nonvolatile memory once the power is turned on again. Thus, malfunction of a memory device with the flash memory can be prevented. Such a technique is described for example in Japanese Laid-Open Patent Publication NO. 2005-222202.

SUMMARY

In order to address the problem of power supply shutdown in another circuit by using information such as flags written in the nonvolatile memory, the information read out from the nonvolatile memory must be reliable information. However, power supply shutdown may occur also during writing, rewriting or erasing of data in the nonvolatile memory. If this happens, the information read out from the nonvolatile memory is not always correct or reliable.

The readout of information from a relevant nonvolatile memory is performed by applying a data determination level voltage to a control gate of a floating-gate type transistor forming each memory cell. The threshold voltage of a floating-gate type transistor varies in accordance with data written therein. Therefore, the data written in the memory cell can be known based on whether the cell transistor is in the on state or off state when the data determination level voltage is applied. In the case of a binary memory cell, for example, the data is "1" if drain current flows when the data determination level voltage is applied to the control gate, while it is "0" if no drain current flows. This means that when the threshold voltage of the transistor is lower than the data determination level voltage, the data is "1", while it is "0" when the threshold voltage of the transistor is higher than the data determination level voltage.

There will be no particular problem if the threshold voltage of the binary memory cell has a value that is sufficiently higher or lower than that of the data determination level voltage. However, if the threshold voltage has a value close to that of the data determination level voltage, the written information will be determined to be either "0" or "1" even though it is not fully ascertained (even though it is an unstable bit).

For example, as shown in FIG. 1, data in a memory cell is clearly "0" when the memory cell has a threshold voltage Vth[V] sufficiently higher than a data determination level voltage Vref[V], or a threshold voltage Vth[V] belonging to an area "A". On the other hand, data in a memory cell is clearly "1", when the memory cell has a threshold voltage Vth[V] sufficiently lower than the data determination level voltage Vref[V], or a threshold voltage Vth[V] belonging to an area "B". In contrast, data in a memory cell cannot be clearly determined whether it is "0" or "1" when the memory cell has a threshold voltage Vth[V] close to the data determination level voltage Vref[V], or a threshold voltage Vth[V] belonging to an area "C". Moreover, this data in the memory cell having the threshold voltage Vth[V] belonging to the area "C" is possibly determined to be either "0" or "1" depending on temperature variation, or variation in the data determination level voltage Vref[V].

The present inventor has recognized that the method of determining information written in a relevant nonvolatile memory as described above, which is based on simple comparison between a threshold voltage of a cell transistor and a data determination level voltage, has a problem that it is ambiguous whether the information read out from the memory is reliable or not.

This problem becomes more significant as the number of data levels in the memory cell is increased. This is because, as shown FIG. 2, as the number of data levels in the memory cell is increased, a difference between a threshold voltage indicating a logical value and a threshold voltage indicating an adjacent another logical value becomes smaller, and thus a difference between the threshold voltages indicating the respective logical values and data determination level voltages Vref1 to Vref3 corresponding thereto becomes smaller (the margin becomes smaller).

The present inventor also has recognized that the above-mentioned method also has a problem that, when information read out from a nonvolatile memory is not correct, a system error possibly occurs in a system using this information.

It is therefore the present invention seeks to solve one or more of the above problems, or to improve upon those problems at least in part.

In one embodiment, there is provided a semiconductor integrated circuit including a nonvolatile memory cell. The semiconductor integrated circuit comprises a detecting voltage control circuit which sequentially supplies two or more mutually different unstable bit detecting voltages to the control gate of the nonvolatile memory cell to cause the nonvolatile memory cell to output a plurality of pieces of readout data. A determination circuit compares the plurality of pieces of readout data to determine whether the nonvolatile memory cell is stable or unstable.

In another embodiment, there is provided an unstable bit detection method for a semiconductor integrated circuit including a nonvolatile memory cell. In the method, two or more mutually different unstable bit detecting voltages are sequentially applied to the nonvolatile memory cell to perform a plurality of read operations. A plurality of pieces of readout data thus obtained are compared to each other to determine whether the data written in the nonvolatile memory cell is stable or not.

According to the method, a plurality of read operations are performed while varying the voltage applied to the control gate, so that a plurality of pieces of readout data are compared. This makes it possible to detect an unstable bit with high precision.

BRIEF DESCRIPTION OF THE DRAWINGS

The above features and advantages of the present invention will be more apparent from the following description of certain preferred embodiments taken in conjunction with the accompanying drawings, in which:

FIG. 8 is a diagram for explaining relationship between inputs and outputs of a signal path B latch unit in the OK/NG determination circuit of FIG. 7;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 3:
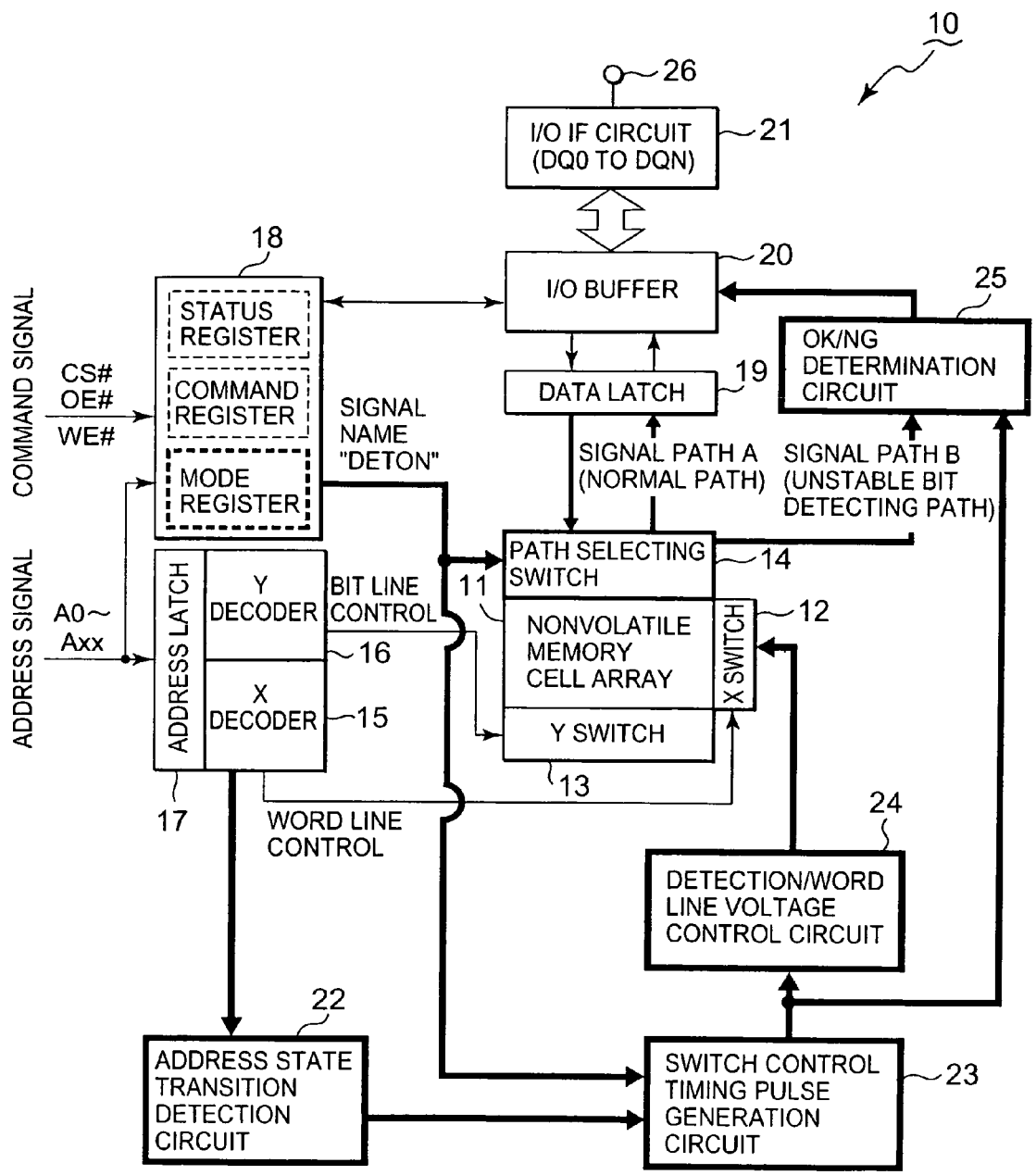
FIG. 3 is a block diagram schematically showing a configuration of a semiconductor integrated circuit according to a first embodiment of the present invention.

FIG. 3 shows a schematic configuration of a semiconductor integrated circuit (nonvolatile memory) 10 according to a first embodiment of the present invention. Referring to FIG. 3, the nonvolatile memory 10 includes a nonvolatile memory cell array 11 in which a multiplicity of nonvolatile memory cells are arranged, an X-switch 12, a Y-switch 13, a path selecting switch 14, an X-decoder 15, a Y-decoder 16, an address latch circuit 17, a register group 18, a data latch circuit 19, an input/output buffer 20, an input/output IF circuit 21, an address state transition detection circuit 22, a switch control timing pulse generation circuit 23, a detection/word line voltage control circuit 24, and an OK/NG determination circuit 25.

In FIG. 3, blocks outlined by heavy lines (14, 22 to 25) represent those parts in which the nonvolatile memory 10 is significantly different from an existing nonvolatile memory. The path selecting switch 14 serves to supply bit line data from the nonvolatile memory cell array 11 for either data latch circuit 19 or the OK/NG determination circuit 25. The data latch circuit 19 functions as a first latch circuit for latching data read out during a normal operation. The input/output buffer 20 outputs the readout data latched by the data latch circuit 19 to an external data terminal(s) 26 via the input/output IF circuit 21. The switch control timing pulse generation circuit 23 functions as a timing pulse signal generation circuit. The detection/word line voltage control circuit 24 functions as a detecting voltage control circuit as well as a determination voltage control circuit. The OK/NG determination circuit 25 functions as a determination circuit.

Normal write and read operations in the nonvolatile memory of FIG. 3 are the same as those of the existing nonvolatile memories, and hence description thereof will be omitted. A description will be made on an unstable bit detection operation.

In the first place, principles of the unstable bit detection method in the nonvolatile memory of FIG. 3 will be described with reference to FIG. 4.

Figure 4:
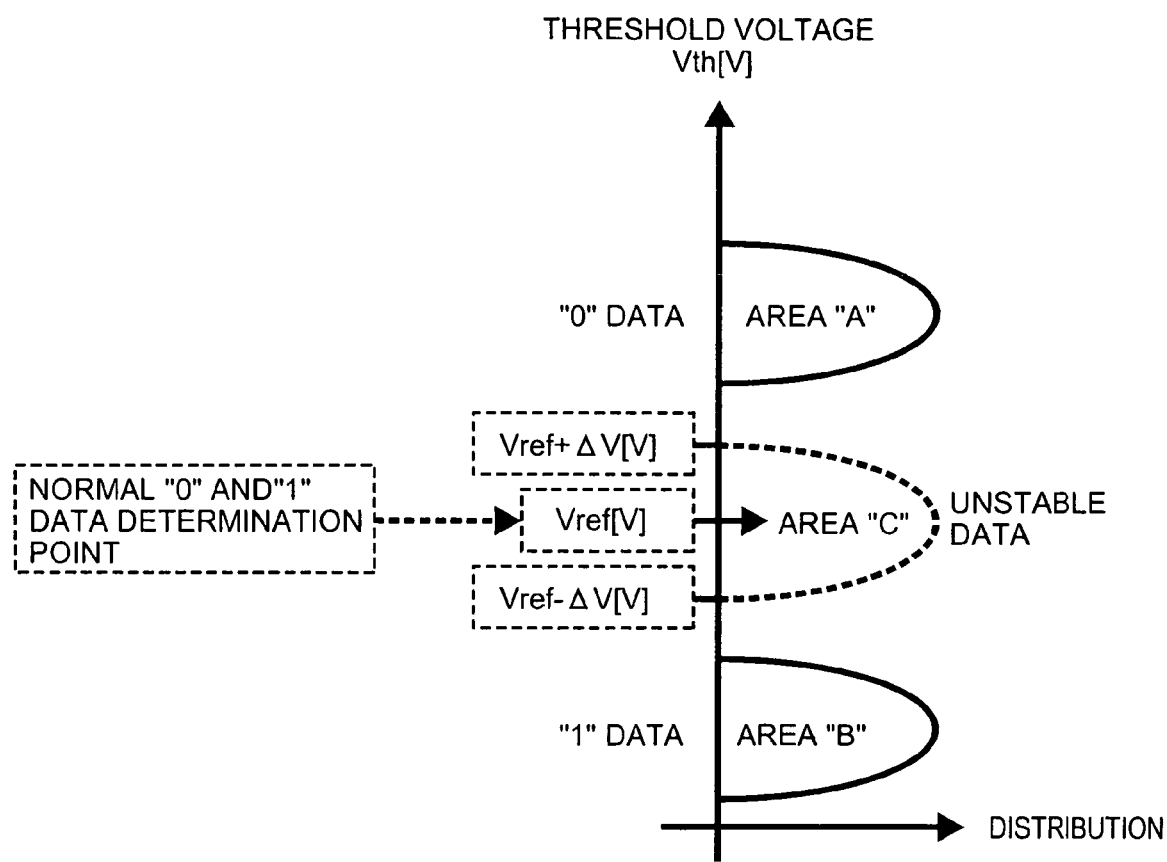
FIG. 4 is a graph showing distribution of threshold voltages of memory cells in a nonvolatile memory cell array.

FIG. 4 is a graph showing distribution of threshold voltages of the memory cells in the nonvolatile memory cell array.

A memory cell includes a memory cell transistor. The memory cell transistor has a threshold voltage Vth[V] which varies according to a stored information stored therein. Typically, the threshold voltage Vth[V] belongs to a first area "A" when the memory cell stores a first information such as "0". On the other hand, the threshold voltage Vth[V] belongs to a second area "B" when the memory cell stores a second information such as "1". There is a third area "C" between the area "A" and "B". The area "C" includes a predetermined voltage (or a reference voltage) equal to a data determination level voltage Vref[V]. Thus, the areas "A", "B" and "C" are set regarding to the threshold voltage Vth[V] of the memory cell transistor.

When a memory cell transistor has a threshold voltage Vth[V] which is in the area "A" of FIG. 4, the threshold voltage Vth[V] is sufficiently higher than the data determination level voltage Vref[V]. Therefore, no drain current flows and hence readout data is "0" not only when the data determination level voltage Vref[V] is applied to the control gate of the memory cell transistor but also when a voltage Vref+ΔV [V] higher than that is applied.

When a memory cell transistor has a threshold voltage Vth[V] which is in the area "B", the threshold voltage Vth[V] is sufficiently lower than the data determination level voltage Vref[V]. Therefore, drain current flows and hence readout data is "1" not only when the data determination level voltage Vref[V] is applied to the control gate of the memory cell transistor but also a voltage Vref−ΔV[V] lower than that is applied.

In contrast, when a memory cell transistor has a threshold voltage Vth[V] which is in the area "C", the threshold voltage Vth[V] is close to the data determination level voltage Vref[V]. Therefore, readout data is "1" when the voltage Vref+ΔV[V] is applied to the control gate, whereas readout data is "0" when the voltage Vref−ΔV[V] is applied.

When the voltage applied to the control gate is varied in a certain range (within a margin), the readout data from the memory cell whose threshold voltage Vth[V] is in the area "C" is also varied. According to the present invention, a plurality of read operations are performed for the same data information while changing the applied voltage in a stepwise manner within a predetermined range, whereby it is detected whether the readout data is varied or not and thus any unstable bit is detected.

Figure 5:
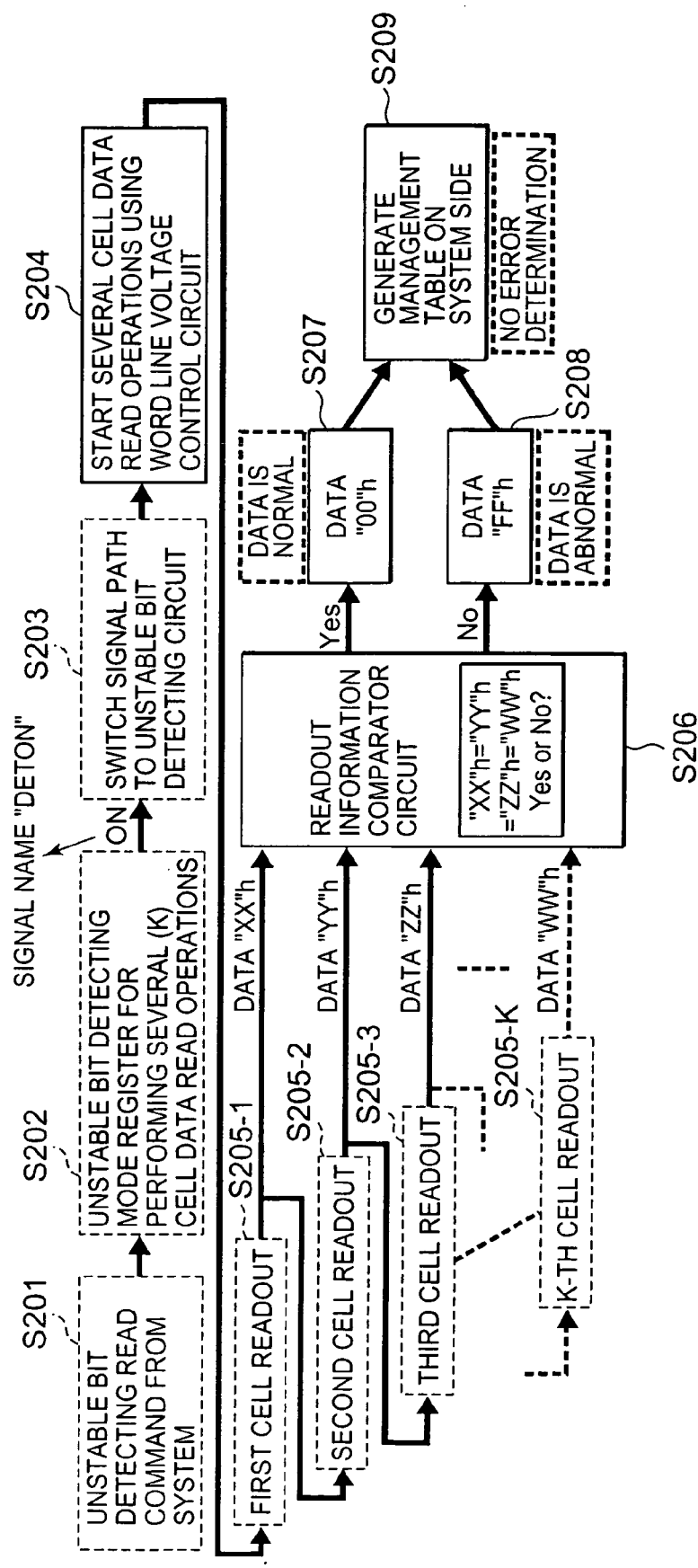
FIG. 5 is a sequence diagram for explaining operation to detect an unstable bit in the semiconductor integrated circuit shown in FIG. 3.

Operation of the nonvolatile memory of FIG. 3 will be described in more detail with reference to FIG. 5.

Firstly, upon receiving from an external control system (not shown) an unstable bit detecting read command (command signal) for detecting an unstable bit (S201), an unstable bit detecting mode register for performing several cell data read operations latches the received command signal (S202). The mode register then outputs the latched command signal, as a mode signal "DETON", to the path selecting switch 14 and the switching control timing pulse generation circuit 23.

The path selecting switch 14 is a switch for switching the path of a signal output from the nonvolatile memory cell 11 between a normal path A and an unstable bit detecting path B. Upon receiving the mode signal "DETON", the path selecting switch 14 switches over the output signal path from the normal path A to the unstable bit detecting path B (S203).

Next, cell data is read out for a plurality of times (K times, K being an integer of 2 or more) from a nonvolatile memory cell corresponding to an address signal from the control system not shown (S204). During this, the detection/word line voltage control circuit 24 sequentially generates K different word line (gate) voltages. The detection/word line voltage control circuit 24 generates a data determination level voltage (e.g. Vref[V] in FIG. 4) during a normal memory cell read operation, whereas generates word voltages including two or more voltages (e.g. Vref+ΔV[V] and Vref−ΔV[V] in FIG. 4) different from the data determination level voltage during an unstable bit detection operation.

The switching control timing pulse generation circuit 23 informs the detection/word line voltage control circuit 24 of a timing at which the detection/word line voltage control circuit 24 generates K mutually different word line voltages based on the mode signal "DETON" and an address state transition detection pulse signal from the address state transition detection circuit 22.

The K word line voltages from the detection/word line voltage control circuit 24 are sequentially supplied to the control gate of a memory cell transistor to be detected via the X-switch 12, so that a read operation is conducted. The readout data is fed to the OK/NG determination circuit 25 via the path selecting switch 14 and the signal path B.

The OK/NG determination circuit 25 has K read latch units so that K pieces of readout data ("XX"h, "YY"h, "ZZ"h, . . . "WW"h) are latched sequentially one by one by using K word voltages (S205-1 to S205-K). Further, the OK/NG determination circuit 25 has a readout information comparator (circuit) to compare the K pieces of readout data with each other (S206).

When all the K pieces of readout data match, the OK/NG determination circuit 25 outputs a determination result, for example "00"h, indicating that the data is normal (S207). On the other hand, when all the pieces of readout data do not match, the OK/NG determination circuit 25 outputs a determination result, for example "FF"h, indicating that the data is abnormal (S208).

The determination result is output to the external control system via the input/output buffer 20 and the input/output IF circuit 21. The control system generates a management table based on the determination result (S209).

The nonvolatile memory according to this embodiment is thus capable of detecting an unstable bit with high precision. Further, the nonvolatile memory according to this embodiment is capable of preventing malfunction of the control system.

The detection/word line voltage control circuit 24 will be described in detail with reference to FIG. 6. The nonvolatile memory cell array 11 is assumed to be a cell array in which a multiplicity of binary memory cells are arranged, and K is assumed to be three (three read operations are performed). The term "binary memory cell" as used herein means a cell memory which is designed to determine whether written data is "0" or "1" by using a single data determination level voltage.

Figure 6:
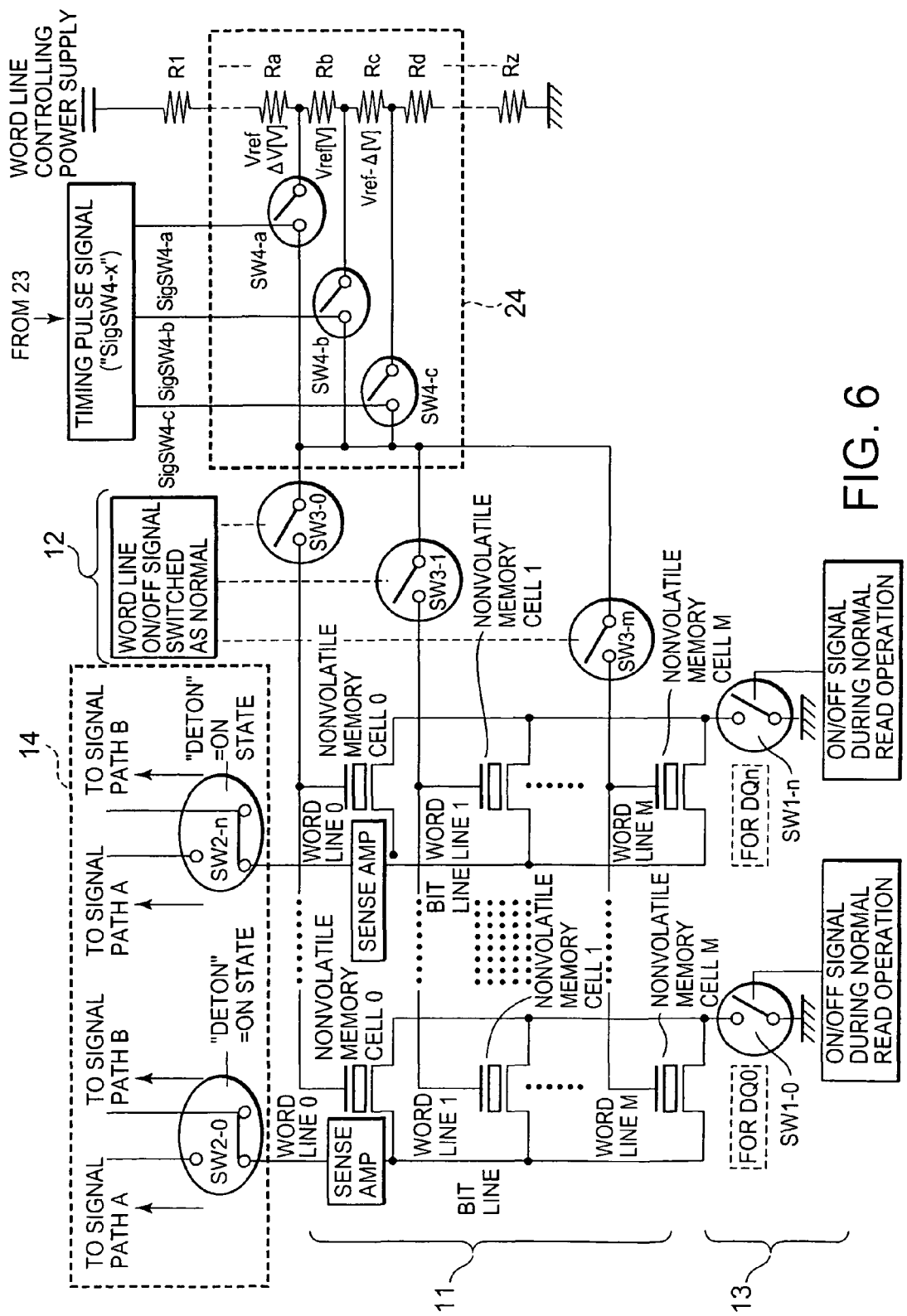
FIG. 6 is a circuit diagram showing particulars of a nonvolatile memory cell array and a detection/word line voltage control circuit of the semiconductor integrated circuit shown in FIG. 3 and peripheries thereof.

FIG. 6 is a circuit diagram showing details of the nonvolatile memory cell array 11, the path selecting switch 14, and the detection/word line voltage control circuit 24.

The nonvolatile memory cell array 11 has a common configuration. A predetermined voltage is applied to a word line of each memory cell, and readout data is determined to be "1" if electric current flows through the bit line whereas readout data is determined to be "0" if no current flows.

The path selecting switch 14 includes switches SW2-0 to SW2-n (n indicates a value obtained by subtracting one from the number of bit lines (corresponding to DQ0 to DQn)) connected to the bit lines, respectively. The switches SW2-0 to SW2-n are controlled by the "DETON" signal from the mode register. Specifically, each of the switches SW2-0 to SW2-n connects the relevant bit line to the signal path A when the "DETON" signal is not input, whereas connects the relevant bit line to the signal path B when the "DETON" signal is input. FIG. 6 shows a state in which the "DETON" signal is input and each of the switches SW2-0 to SW2-n connects the bit line to the signal path B.

The Y-switch 13 includes switches SW1-1 to SW1-n connected to the respective bit lines. These switches SW1-1 to SW1-n are controlled in the same manner as in a normal read operation.

The X-switch 12 includes switches SW3-1 to SW3-m (m is a value obtained by subtracting one from the number of word lines) connected to the respective word lines. These switches SW3-1 to SW3-m are controlled in the same manner as in a normal read operation.

The detection/word line voltage control circuit 24 includes K (three, herein) switches SW4-a, SW4-b, SW4-c connected in common to the switches SW3-1 to SW3-m of the X-switch 12, and voltage-dividing resistors R1, . . . , Rz for supplying mutually different voltages to these switches. The number of voltage-dividing resistors will suffice if it is equal to a value obtained by adding one to the number of voltages to be generated.

The voltage-dividing resistors R1, . . . , Rz are connected such that, when a data determination level voltage is indicated by Vref[V], a voltage Vref+ΔV[V] is supplied to the switch SW4-a, a voltage Vref[V] to the switch SW4-b, and a voltage Vref−ΔV[V] to the switch SW-c. These voltages are utilized as unstable bit determination level voltages.

The switches SW4-$a$, SW4-$b$, and SW4-$c$ are controlled by timing pulse signals SigSW4-$a$, SigSW4-$b$, and SigSW4-$c$ from the switching control timing pulse generation circuit 23. Specifically, when the timing pulse signals SigSW4-$a$, SigSW4-$b$, and SigSW4-$c$ are supplied properly, only the switch SigSW4-$b$ is turned on to supply the voltage Vref[V] to the word line during a normal read operation. During an unstable bit detection operation, the switches SW4-$a$, SW4-$b$ and SW4-$c$ are sequentially turned on one by one so that the voltages Vref+ΔV[V], Vref[V] and Vref−ΔV[V] are sequentially supplied to the word line. Generation of the timing pulse signals SigSW4-$a$, SigSW4-$b$, and SigSW4-$c$ will be described later.

By the sequential supply of the voltages Vref+ΔV[V], Vref[V] and Vref−ΔV[V] to the word line, K (=3) read operations are performed on the memory cell. The K pieces of readout data thus obtained are supplied to the OK/NG determination circuit 25 via the path selecting switch 14.

Figure 7:
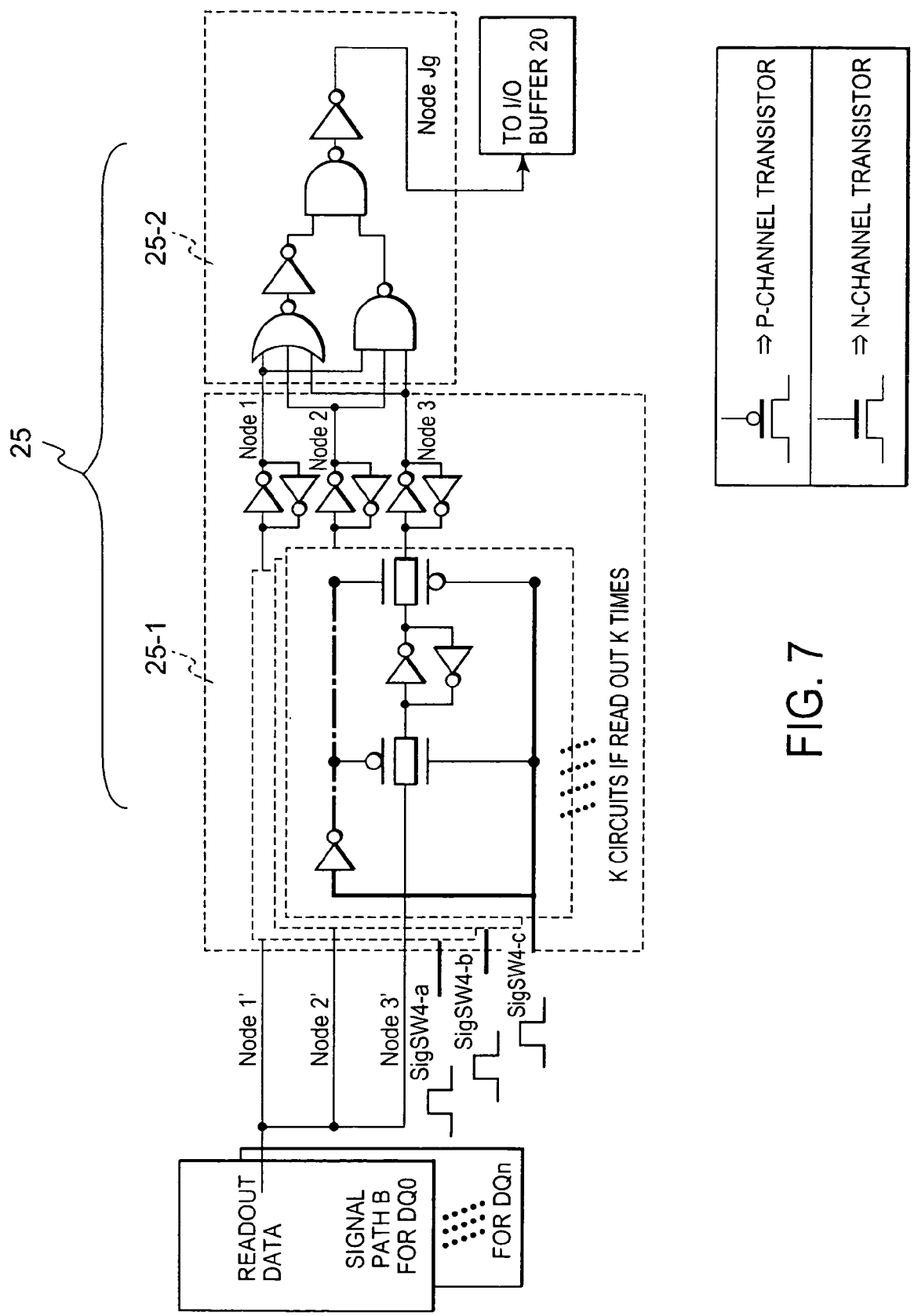
FIG. 7 is a circuit diagram showing an internal configuration of an OK/NG determination circuit of the semiconductor integrated circuit shown in FIG. 3.

FIG. 7 shows an internal configuration of the OK/NG determination circuit 25. As shown in FIG. 7, the OK/NG determination circuit 25 has a signal path B latch unit 25-1 and a comparator unit (comparator circuit) 25-2.

The signal path B latch unit 25-1 includes K latch circuits, each of which latches readout data input via the path selecting switch 14 by using a timing pulse signal from the switching control timing pulse generation circuit 23. Specifically, when the timing pulse signal becomes "high", the readout data is transferred to the latch circuit, whereas when the timing pulse signal becomes "low", the readout data is latched. Thus, the data is supplied to nodes Node1, Node2, and Node3, respectively.

FIG. 8 shows a relationship among the readout data (states of the nodes Node1', Node2', and Node3') input to the signal path B latch unit 25-1, the timing pulse signals (SigSW4-$a$, SigSW4-$b$, and SigSW4-$c$), and the states of the nodes Node1, Node2, and Node3.

As shown in FIG. 8, the same data values DataValue1, DataValue2, and DataValue3 are sequentially supplied to the K latch circuits (Node1', Node2', and Node3'). Further, the timing pulse signals SigSW4-$a$, SigSW4-$b$, and SigSW4-$c$ are sequentially supplied to the K latch circuits. As a result, a data value DataValue1 appears at the node Node1 when the timing pulse signal SigSW4-$a$ is input. A data value DataValue2 appears at the node Node2 when the timing pulse signal SigSW4-$b$ is input. A data value DataValue3 appears at the node Node3 when the timing pulse signal SigSW4-$c$ is input.

Figure 9:
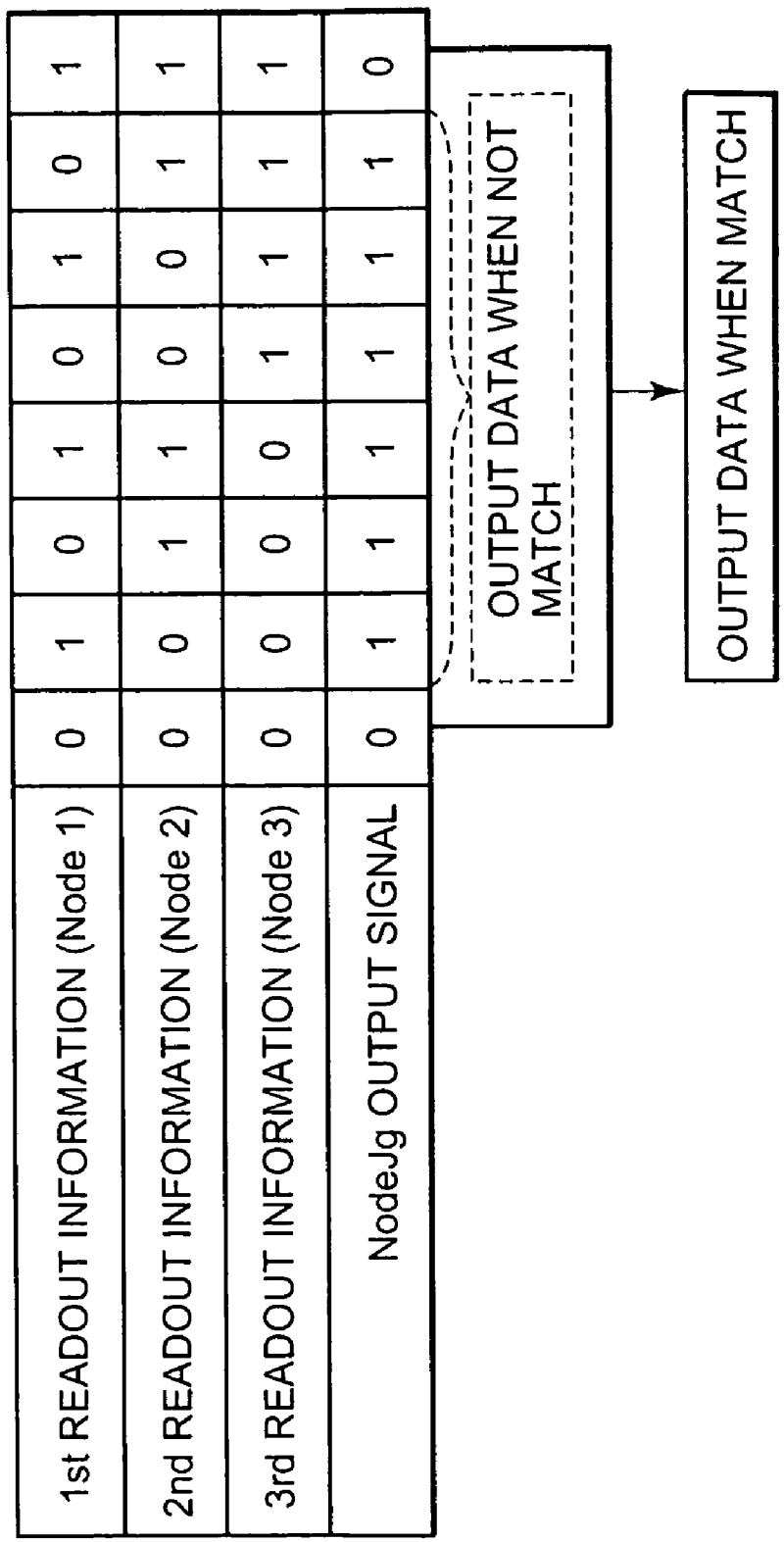
FIG. 9 is a truth value table of a comparator in the OK/NG determination circuit of FIG. 7.

The comparator 25-2 outputs a determination result according to the states of the nodes Node1, Node2, and Node3. FIG. 9 shows a truth value table of the comparator 25-2. As shown in FIG. 9, the comparator 25-2 outputs "0" as the determination result NodeJg when all of the nodes Node1, Node2, and Node3 are either "0" or "1", and otherwise outputs "1".

The determination result NodeJg is sent to the control system via the input/output buffer 20 and the input/output IF circuit 21.

The control system is capable of determining whether information in the memory cell to be read is unstable or not depending on whether the determination result NodeJg with respect to an address to be read is "0" or "1", and thus is capable of generating a management table correctly. This makes it possible to prevent malfunction of the control system.

Here, consideration is made on the case in which a plurality of comparators 25-2 are arranged in parallel. In the case in which eight comparators 25-2 are arranged in parallel, for example, a circuit for outputting the determination results from these comparators all together can be provided on the output side thereof, so that, as described above, a determination result of "00"h is output if all the readout data pieces match, and "FF"h is output if they don't match.

A description will be made on generation of a timing pulse signal with reference to FIGS. 10 to 13.

As described with reference to FIG. 3, the switching control timing pulse generation circuit 23 generates a timing pulse signal based on a mode signal "DETON" from the register group 18 and an address state transition detection pulse signal from the address state transition detection circuit 22.

The mode signal "DETON" is dependent on a command from the control system, while the address state transition detection signal is dependent on an address signal from the control system.

Figure 10:
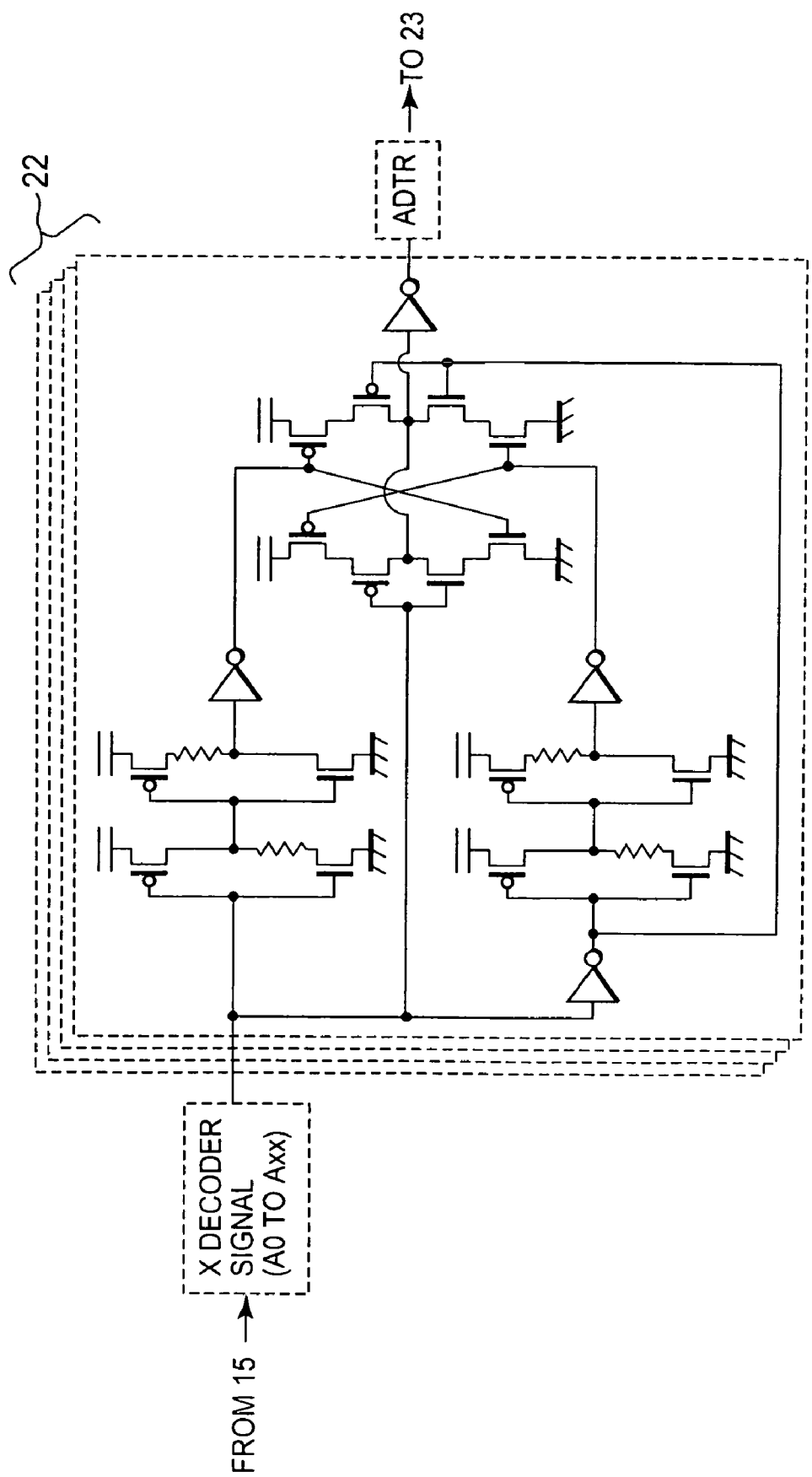
FIG. 10 is a circuit diagram showing an internal configuration of an address state transition detection circuit of the semiconductor integrated circuit of FIG. 3.
Figure 11A:
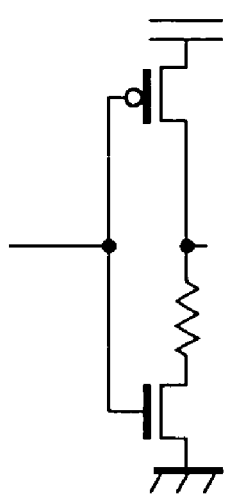
FIGS. 11A and 11B are circuit diagrams showing inverter circuits used in the address state transition detection circuit of FIG. 10.
Figure 11B:
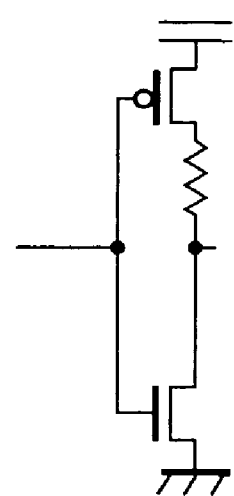

The address state transition detection circuit 22 for generating an address state transition detection signal is configured, for example, as shown in FIG. 10. The address state transition detection circuit 22 includes an inverter circuit for delaying a logic low output and an inverter circuit for delaying a logic high output shown in FIGS. 11A and 11B, respectively. Receiving an X-decoder signal from the X-decoder 15, the address state transition detection circuit 22 detects transition of the address state and outputs an address state transition detection pulse signal ADTR to the switching control timing pulse generation circuit 23.

Figure 12:
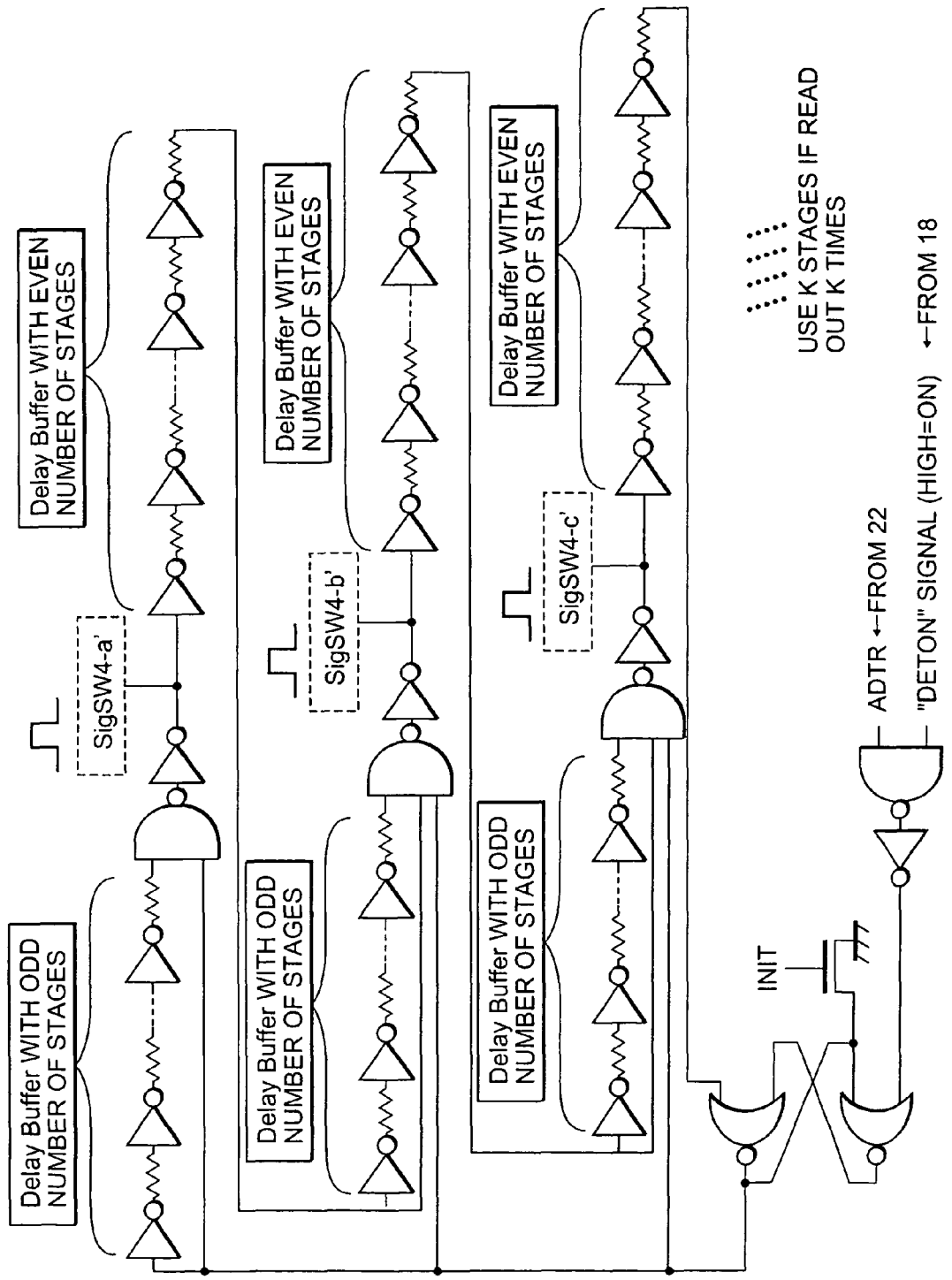
FIG. 12 is a circuit diagram showing a pre-stage circuit forming a switching control timing pulse generation circuit of the semiconductor integrated circuit shown in FIG. 3.
Figure 13A:
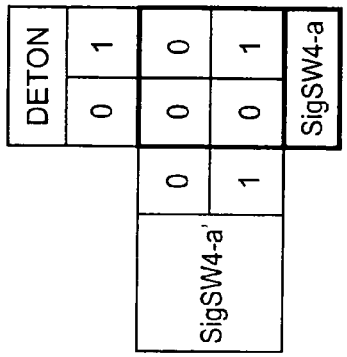
FIGS. 13A, 13B and 13C are circuit diagrams and truth value tables thereof, showing post-stage circuits forming the switching control timing pulse generation circuit of the semiconductor integrated circuit shown in FIG. 3.
Figure 13A:
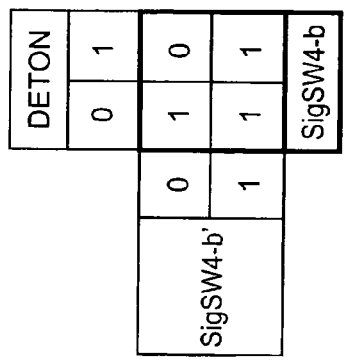
Figure 13A:
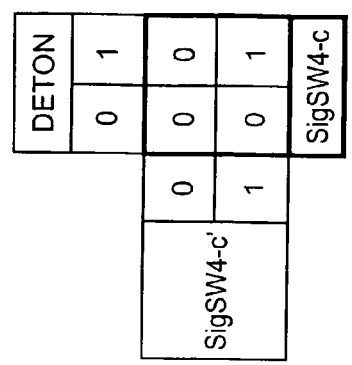
Figure 13A:
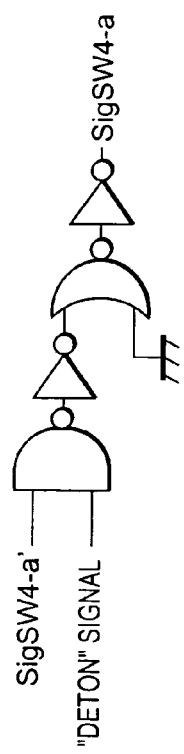
Figure 13B:
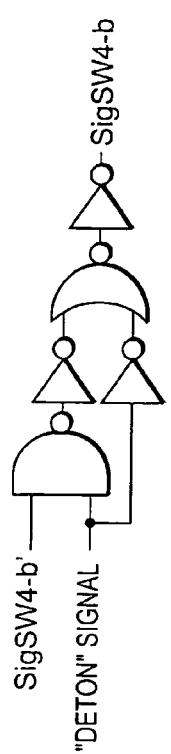
Figure 13C:
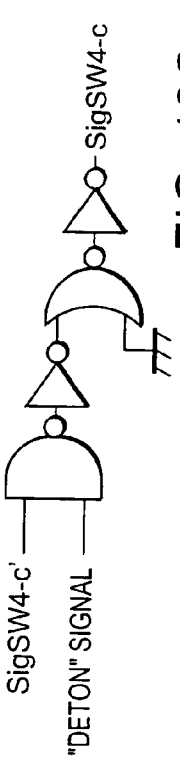

The switching control timing pulse generation circuit 23 is for example composed of a pre-stage circuit as shown in FIG. 12 and a post-stage circuit as shown on the left side of FIGS. 13A, 13B and 13C.

Preliminary signals SigSW4-$a$', SigSW4-$b$' and SigSW4-$c$' generated by the pre-stage circuit shown in FIG. 12 are supplied respectively to the post-stage circuits shown on the left side of FIGS. 13A 13B and 13C. FIGS. 13A 13B and 13C show, on the right side thereof, truth value tables of the respective post-stage circuits. As shown in these truth value tables, the post-stage circuits generate timing pulse signals SigSW4-$a$, SigSW4-$b$ and SigSW4-$c$, timings of which are delayed from each other, based on the mode signal "DENTON" and the preliminary signals SigSW4-$a$', SigSW4-$b$' and SigSW4-$c$'.

Although in the shown embodiment the preliminary signals SigSW4-$a$', SigSW4-$b$' and SigSW4-$c$' are generated by detecting transition of the address state, they may be generated by using a write command or read command.

While the present invention has been described in terms of a first embodiment thereof, the present invention is not limited to this.

For example, although three read operations are performed for determination of an unstable bit according to the above-described embodiment, the unstable bit determination can be performed by performing two read operations using voltages Vref+ΔV[V] and Vref−ΔV[V] within the margin. Further, four or more read operations may be performed to improve the determination precision.

When the number of read operations is increased, the number of switches SW4 of the detection/word line voltage control circuit 24 (see FIG. 6) should be increased accordingly and these switches SW4 are connected to voltage-dividing resistors such that an appropriate voltage is applied to each of the switches, while timing pulse signals SigSW4 corresponding thereto are generated.

Alternatively, the circuit may be designed to be capable of performing at a maximum of K read operations, so that the number of read operations is determined during use. This can be realized, for example, by connecting switches between nodes of the signal path B latch unit 25-1. Specifically, when there exists an unused latch circuit in the signal path B latch unit 25-1, the detection of an unstable bit can be performed in the same manner as described above, by controlling the switches between the nodes such that the node corresponding to the unused latch circuit is connected to the node corresponding to another used latch circuit.

Figure 1:
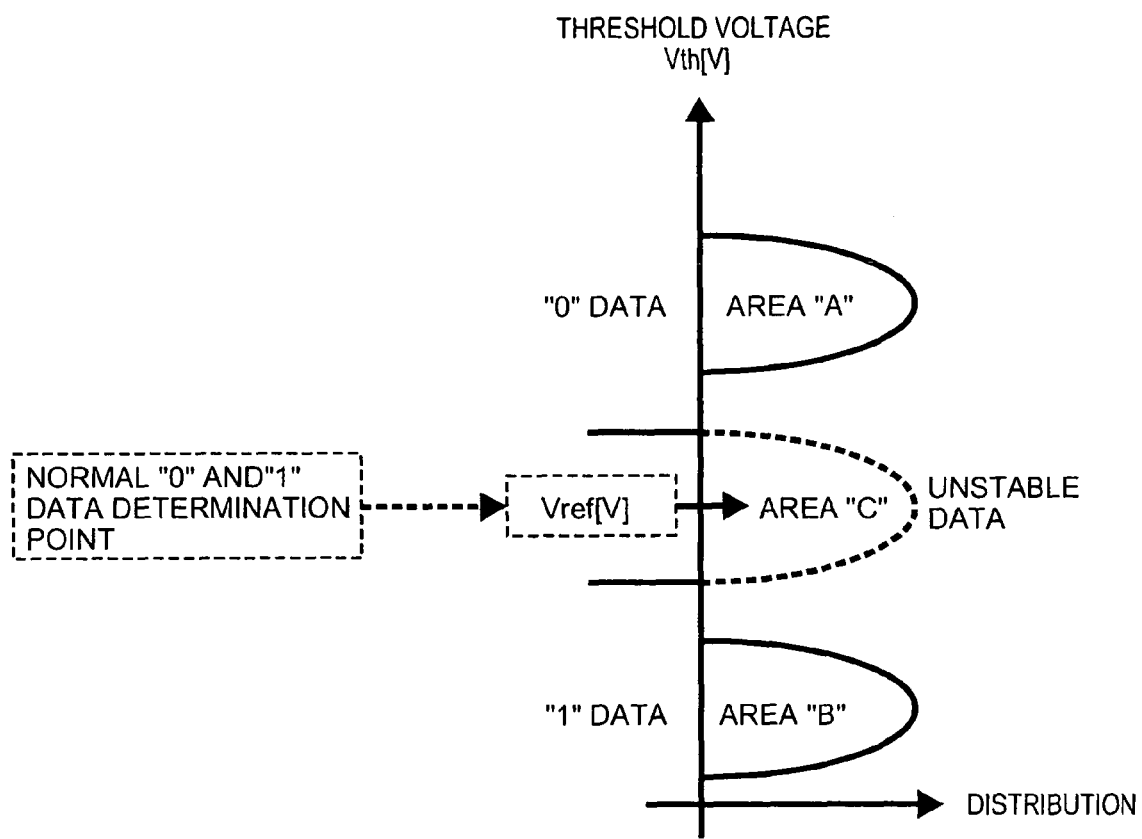
FIG. 1 is a diagram for explaining problems of a related data determination method, being a graph showing distribution of threshold voltages of binary memory cells in a nonvolatile memory cell array.
Figure 2:
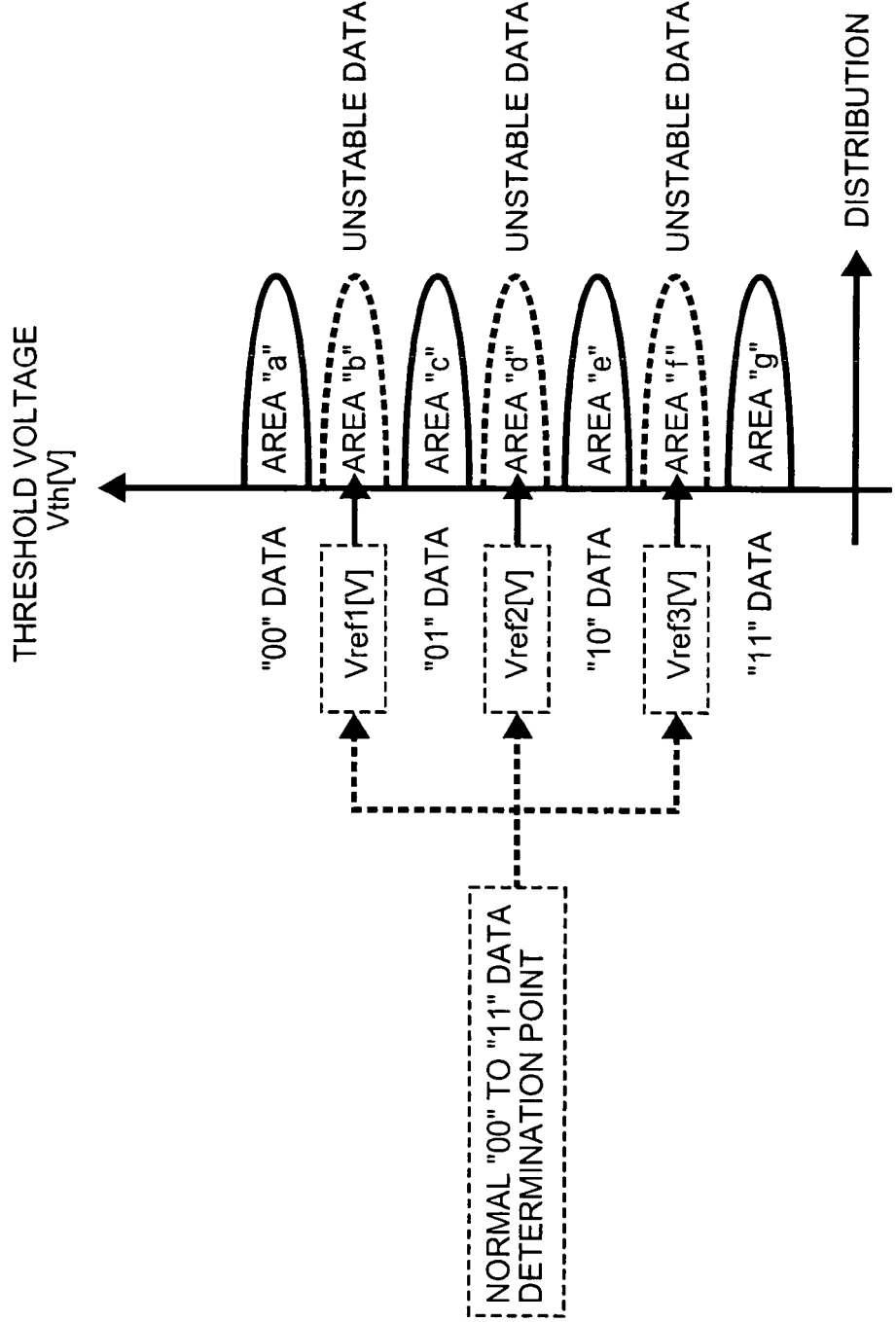
FIG. 2 is a diagram for explaining problems of a related data determination method, being a graph showing distribution of threshold voltages of multi-level memory cells in a nonvolatile memory cell array.
Figure 14:
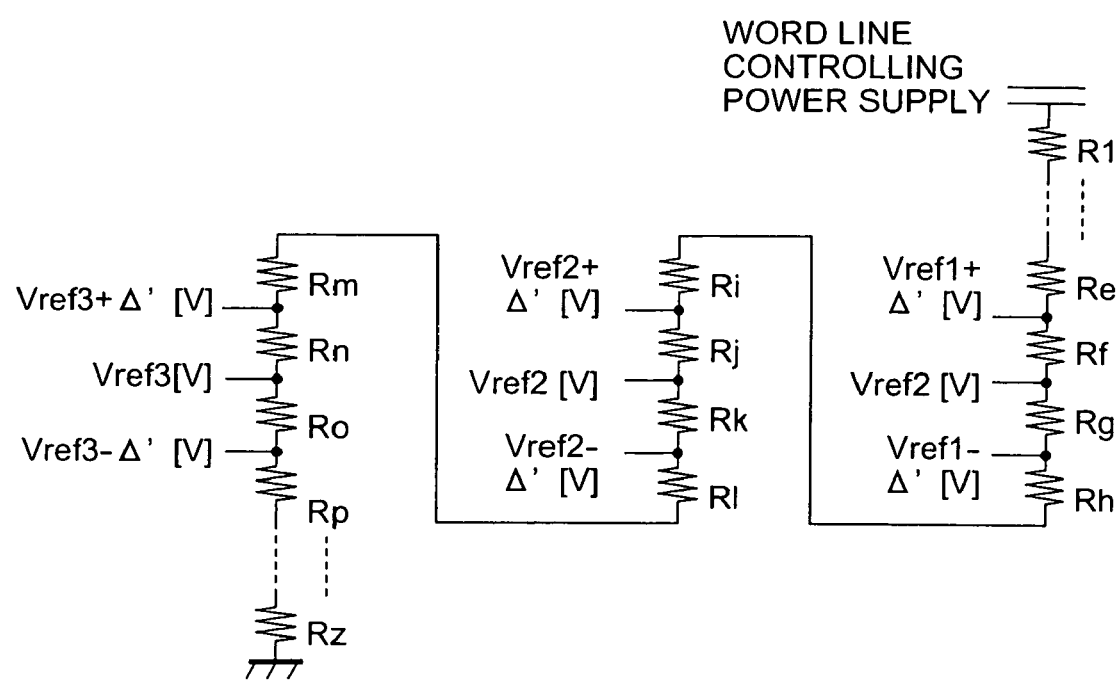
FIG. 14 is a circuit diagram for explaining another configuration example of the detection/word line voltage control circuit of the semiconductor integrated circuit shown in FIG. 3.

Although the description of the embodiments has been made in terms of binary memory cells, the present invention is also applicable to multi-level memory cells. In the case of using multi-level memory cells, a plurality of different data determination levels are used to perform determination on written data. For example, when using four-level memory cells (see FIG. 2), three different data determination level voltages Vref1 to Vref3 are sequentially applied to the control gate to determine whether drain current flows or not and thereby to determine which is the readout data, "00", "01", "10" or "11". When the present invention is applied to such four-level memory cells, the detection/word line voltage control circuit 24 is required to generate nine (3×3=9) voltages on the assumption that three read operations are performed to detect unstable bits. In this case, the detection/word line voltage control circuit 24 may generate nine different voltages by using voltage-dividing resistors as shown in FIG. 14. Additionally, switches SW4 corresponding to the respective voltages are provided, in the same manner as in FIG. 6, so that the voltages are sequentially supplied to the control gate.

It is apparent that the present invention is not limited to the above embodiments, but may be modified and changed without departing from the scope and spirit of the invention.

What is claimed is:

1. A semiconductor integrated circuit comprising:
   a nonvolatile memory cell;
   a detecting voltage control circuit for sequentially supplying two or more mutually different unstable bit detecting voltages to a control gate of the nonvolatile memory cell to cause the nonvolatile memory cell to output a plurality of pieces of readout data; and
   a determination circuit for comparing the plurality of pieces of readout data to determine whether the nonvolatile memory cell is stable or unstable.

2. The semiconductor integrated circuit as claimed in claim 1, further comprising a timing pulse signal generation circuit for generating a timing pulse signal defining timings of sequentially supplying the two or more unstable bit detecting voltages to the control gate of the nonvolatile memory cell, and supplying the generated timing pulse signal to the detecting voltage control circuit.

3. The semiconductor integrated circuit as claimed in claim 2, wherein the detecting voltage control circuit comprises:
   a plurality of voltage-dividing resistors for generating the two or more unstable bit detecting voltages; and
   a plurality of switches connected to the plurality of voltage-dividing resistors and also connected to the timing pulse signal generation circuit, and
   the plurality of switches are turned on and off according to the timing pulse signal, whereby the two or more unstable bit detecting voltages are sequentially supplied to the control gate of the nonvolatile memory cell.

4. The semiconductor integrated circuit as claimed in claim 2, further comprising a path selecting switch for switching, according to an external command, the output path of the nonvolatile memory cell from a normal path to an unstable bit detecting path connected to the determination circuit.

5. The semiconductor integrated circuit as claimed in claim 4, wherein the timing pulse signal generation circuit generates the timing pulse signal according to the command.

6. The semiconductor integrated circuit as claimed in claim 1, wherein the detecting voltage control circuit also functions as a determining voltage control circuit for generating a data determination level voltage used for determining a logic level of data written in the nonvolatile memory cell.

7. The semiconductor integrated circuit as claimed in claim 6, wherein the detecting voltage control circuit generates, as the two or more unstable bit detecting voltages, a first unstable bit determination level voltage which is higher than the data determination level voltage and a second unstable bit determination level voltage which is lower than the data determination level voltage.

8. The semiconductor integrated circuit as claimed in claim 1, wherein the determination circuit comprises:
   a plurality of latch circuits for latching readout data corresponding to the respective two or more unstable bit detecting voltages; and
   a comparator circuit for comparing outputs of the plurality of latch circuits to generate a determination signal indicating whether or not the outputs match.

9. A semiconductor integrated circuit comprising:
   a nonvolatile memory cell having a threshold voltage which varies according to a stored information stored therein, the threshold voltage belonging to any one of a first area for a first information, a second area for a second information and a third area located between the first area and the second area and including a value equal to a predetermined voltage for determining whether the nonvolatile memory cell stores the first information or the second information;
   a word line voltage control circuit connected to a control gate of the nonvolatile memory cell; and
   a determination circuit for making determination on data read out through a bit line connected to the nonvolatile memory cell, wherein:
   readout data corresponding to each of two or more different voltages generated by the word line voltage control circuit is obtained; and
   the determination circuit compares the readout data to determine whether or not the threshold voltage belongs to the third area.

10. The semiconductor integrated circuit as claimed in claim 9, further comprising a timing pulse signal generation circuit for performing control to read the same data information from the nonvolatile memory cell for k times (k≧2), wherein:
    the word line voltage control circuit applies the predetermined voltage to the control gate once during a normal operation; and
    the word line voltage control circuit applies k mutually different voltages to the control gate for k times according to the control by the timing pulse signal generation circuit when determining whether the threshold voltage belongs to the third area or not.

11. The semiconductor integrated circuit as claimed in claim 10, wherein the determination circuit comprises:
    K latch circuits for storing readout data, K being a number corresponding to a number of times to apply the voltages; and
    a logic circuit for indicating that the threshold voltage belongs to the third area based on output signals from the k latch circuits.

12. The semiconductor integrated circuit as claimed in claim 9, further comprising:
- a first latch circuit for latching data read out during a normal operation;
- an input/output buffer for outputting the readout data to an external data terminal; and
- a switch for supplying the bit line data to either the determination circuit or the first latch circuit.

13. The semiconductor integrated circuit as claimed in claim 12, wherein the input/output buffer outputs the readout data via the first latch circuit, and outputs a determination result indicating whether the threshold voltage belongs the third area or not via the determination circuit.

14. A control method for a semiconductor integrated circuit including a nonvolatile memory cell, comprising:
- setting, regarding a threshold voltage of the nonvolatile memory cell, a first area for a first information, a second area for a second information and a third area located between the first area and the second area and including a value equal to a predetermined voltage for determining whether the nonvolatile memory cell stores the first information or the second information;
- performing one read operation by applying the predetermined voltage to a control gate of the nonvolatile memory cell when it is determined whether information stored in the nonvolatile memory cell is the first information or the second information; and
- performing k (k≧2) read operations by applying k different voltages to the control gate of the nonvolatile memory cell when it is determined whether or not the threshold voltage of the nonvolatile memory cell belongs to the third area.

15. The control method as claimed in claim 14, wherein the pieces of data read out with the k or more different voltages are logically synthesized with each other, and the synthesized output is output as a determination result indicating whether the threshold voltage belongs the third area or not.

16. The control method as claimed in claim 14, wherein the control gate of the nonvolatile memory cell is applied with the k or more different voltages at different internal timings.

17. The control method as claimed in claim 14, wherein one of the k or more different voltages is lower than the predetermined voltage and another one of the k or more different voltages is higher than the predetermined voltage.

18. The control method as claimed in claim 17, wherein a read operation is performed with the predetermined voltage during a normal operation, and read operations are performed by applying the k or more different voltages to the control gate when determined whether or not the threshold voltage belongs to the third area.

* * * * *